United States Patent [19]

Ohsaka et al.

[11] 4,306,351
[45] Dec. 22, 1981

[54] METHOD FOR PRODUCING A SEMICONDUCTOR LASER ELEMENT

[75] Inventors: Sigeo Ohsaka; Kanji Fujiwara, both of Kawasaki; Takao Fujiwara, Sagamihara, all of Japan

[73] Assignee: Fujitsu Limited, Kawasaki, Japan

[21] Appl. No.: 185,810

[22] Filed: Sep. 10, 1980

[30] Foreign Application Priority Data

Sep. 10, 1979 [JP] Japan .................................. 54-116002

[51] Int. Cl.³ .............................................. H01L 31/18
[52] U.S. Cl. ..................................... 29/569 L; 29/583; 148/175
[58] Field of Search .................. 29/569 L, 583, 576 R; 148/175

[56] References Cited

U.S. PATENT DOCUMENTS

| | | | |
|---|---|---|---|
| 3,349,475 | 10/1967 | Marinace | 29/583 |
| 3,762,973 | 10/1973 | Gobrail | 29/583 |
| 3,816,906 | 6/1974 | Falckenberg | 29/583 |
| 3,916,510 | 11/1975 | Martin | 29/583 |
| 4,236,296 | 12/1980 | Woolhouse et al. | 29/583 |

Primary Examiner—Donald L. Walton
Attorney, Agent, or Firm—Staas & Halsey

[57] ABSTRACT

A method for producing semiconductor laser elements from a wafer wherein the wafer is prepared having light emitting regions and then the wafer is scribed and cracked in order to form the semiconductor elements. The scribing is executed on a major surface of the wafer in such a way that scratches are formed along a separation line only on the surface of a crystal substrate of the wafer but not on the substrate over the formed light emitting regions. The cleaved surface developed by the cracking step is very flat in an area where the light emitting region is exposed to provide a mirror surface that forms a laser resonator. Desirably, the major surface of the wafer is covered with a protective film on at least the part of the surface over the light emitting region, prior to performing the scribe step. More desirably, this protective film consists of an electrode metal, such as Au or a resin, such as a photoresist material. The scribing is executed wherein scratches are not formed on the crystal substrate surface under the region that is covered with the protection film. This method effectively realizes the cleavage process and results in excellent reproducibility of the physical dimensions of the laser element, while obtaining highly satisfactory characteristics of a laser resonator.

26 Claims, 14 Drawing Figures

METHOD FOR PRODUCING A SEMICONDUCTOR LASER ELEMENT

BACKGROUND OF THE INVENTION

This invention relates to a method for producing a semiconductor laser element, particularly to a method for producing a semiconductor laser element and more having a stripe light emitting region and mirrors for forming a laser resonator which orthogonally cross said light emitting region and are arranged mutually face to face.

A practical semiconductor laser element is realized by the so-called striped structure wherein the light emitting regions are limited to the striped comparatively narrow areas. A laser resonator is indispensable for laser operation and in the semiconductor laser element a pair of mirrors for forming the laser resonator are generally structured at the two element ends which are orthogonally crossing the longitudinal direction of the striped light emitting region. The mirror surface of the laser resonator is required to have an optical flatness. Therefore some ideas have been proposed to make flat the element end surface. Generally, the end surface of these elements, for a laser resonator is made by cleavage of the monocrystal semiconductor wafer comprising the laser element because the cleaved surface of a single crystal wafer is much superior to the ordinary mechanically formed surface in achieving the flatness.

The cleaving process of a wafer is usually carried out without regionally giving a direct mechanical stress to a laser element. A regional stress produces countless minute cracks on the wafer and leaves countless convex and concave areas along the cracks on the cleaved surface, resulting in rough surface. The practical cleaving process is manually conducted in such a way, for example, that a razor blade is put on the wafer end and is driven like a wedge. Therefore, the working efficiency is very bad. The reason is that a semiconductor laser element is generally composed of a small size chip having a side of 1 mm or less. In addition, since it is very difficult to set correctly the cleaving position, the distance between the facing cleaving surfaces, namely a length of the resonator, is difficult to make at a constant value. Of course, the resonator lengths highly influences the oscillation characteristic of the laser element. Thus, in place of the abovementioned conventional method, a novel method which excels in working efficiency and assures a set resonator length with excellent reproducibility is desired.

BRIEF SUMMARY OF THE INVENTION

It is an object of this invention to offer a novel method for producing mutually separated semiconductor laser elements from a semiconductor wafer comprising many semiconductor laser elements.

It is another object of this invention to offer a method for efficiently cleaving a semiconductor wafer in order to make mirror surfaces for a laser resonator.

It is a further object of this invention to offer a method for efficiently forming the mirror surfaces for a resonator of a semiconductor laser which is excellent in optical flatness.

It is still a further object of this invention to offer a novel method for forming mirror surfaces having excellent accuracy in dimensions of laser resonator length by means of the efficient cleaving process.

It is an additional object of this invention to offer a method for producing a semiconductor laser element which is excellent in reproducibility.

According to a producing method of this invention, prepared is a semiconductor wafer wherein the active regions of a semiconductor laser elements are formed. This semiconductor wafer is generally composed of a III-V compound semiconductor monocrystal body. A typical double-hetero structure laser element has a semiconductor body where a plurality of monocrystal semiconductor epitaxial layers are laminated on a monocrystal substrate. An active layer which forms the light emitting region is defined within the epitaxial layers by a couple of hetero-junctions in the direction vertical to the major surface of the layers. In the direction along the major surface, the light emitting region is defined by a current route which is defined, for example, by the selective impurity diffusion technique. Namely, the light emitting regions are partly limited within the epitaxial layers. Generally, the light emitting region has the shape of a long and slender stripe. A plurality of such striped light emitting regions are arranged in parallel within a semiconductor wafer. Such semiconductor wafer can be structured by the conventional manner. In order to produce a large number of semiconductor laser elements, this semiconductor wafer is cleaved orthogonally across the stripes extending in the longitudinal direction and it is divided between the adjacent stripes in the direction parallel to the longitudinal direction of them.

It is a feature of the method of this invention to first of all provide scribes for the semiconductor wafer excluding the light emitting regions in the direction at a right angle to the longitudinal direction of the stripes prior to the cleavage process for the semiconductor wafer. The scribing process is the process for providing comparatively shallow scratches on the surface of the semiconductor monocrystal part, particularly of the epitaxial layer portion of a wafer, for example, with a scriber having a diamond chip or a diamond cutter. Under the scratches formed by scribing, comparatively deep countless minute cracks are formed toward the inside of the monocrystal wafer, and a residual stress remains in a semiconductor crystal along the scratches formed by the scribing. As explained above, the scribed scratches are formed on the wafer excluding the light emitting regions along the line orthogonally crossing the longitudinal direction of the stripes. Then, a cracking process is executed by applying a stress to this wafer in such a manner that the wafer is bended backward along the direction orthogonally crossing the scribing line. This cracking process causes the wafer to be cracked along the scribing line and to be severed. Under the scribed scratches, the severed surface is rought but the area where the light emitting regions is exposed has an optically flat cleavage surface because the striped light emitting regions do not allow cracks to occur in the scribing process. On the severing surface across the light emitting regions, cleavage occurs along a crystal surface extending along the production line of the scribed scratches in both sides of such severing surface. Therefore, the surface of the area where the light emitting region is exposed, i.e., the surface which forms a mirror surface of the laser resonator, is a crystalline surface and is very flat. The laser resonator requires, of course, a pair of mirror surfaces arranged face to face and this pair of mirror surfaces are composed of a pair of element end surfaces arranged face to face.

In the method of this invention, a protective film for scribing is desirably formed partly on the semiconductor wafer prior to the scribing process. A protective film may be composed of a resin or metal material. Desirably, this protective film is composed of a photo resin or a metal material for a laser element electrode such as gold. Particularly when the latter material is used for the protective film, a metal film can also be used in common as the element electrode. This protective film is partly formed on the wafer covering the striped light emitting region, with the remaining areas being exposed. In the scribing process, the scribing is performed also across the light emitting region. However, the protective film protects the crystal surface below it from scratches formed by the scribing. In other words, a thickness of the protective film and a scribing pressure are so selected that the wafer crystal surface on the wafer surface not protected by the protective film is given the scratches by scribing, but the area protected by the protective film is not given the scratches by scribing. Therefore the scribing process can be realized in such a manner as drawing a line across the wafer surface in the direction orthogonally crossing the stripes by means of a diamond scriber, and this scribing can be done very easily with an excellent reproducibility.

According to another modification, the protective film may have a minute gap along the planned severing line. However, this gap should be restricted by the following conditions that the width should be narrower than the chip diameter of scriber and consequently scratches by scribing should not be formed within the gap during scribing. This modification will bring about an outstanding advantage, particularly when the element metal electrode is used as the protective film. Since severing or cleaving of a wafer is carried out along the gap, there is no need of tearing off the electrode metal film in the cracking process.

Other objects and features of this invention will become more obvious from the following detailed description.

DETAILED DESCRIPTION OF THE INVENTION

Figure 1:
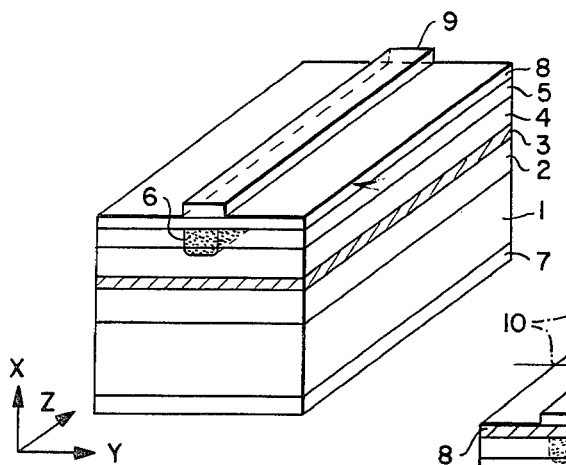
FIG. 1 is a perspective view indicating an embodiment of a semiconductor laser element produced by the method of this invention.

By referring to FIG. 1, a typical example of a semiconductor laser element to be produced by this invention will be first explained.

FIG. 1 shows a semiconductor laser element, particularly a semiconductor laser providing a double hetero (DH) structure of a $G_aA_s$-$G_{al}$-$xAlxA_s$ system. This laser element has the following structure wherein a clad layer 2 consisting of n type GaAlAs, an active layer 3 of p type GaAs, a clad layer 4 consisting of p type GaAlAs and an n type GaAs cap layer 5 are sequentially formed by a conventional liquid phase epitaxial growth technique on an n type GaAs substrate 1. Moreover a p type striped region 6 is formed by diffusing Zn in the striped region 6, an ohmic contact layer 7 of an AuGeNi alloy which is used as the one electrode is provided at the bottom side of said substrate 1. An ohmic contact layer 8 consisting of Ti-Pt alloy which is used as the other electrode and electrode 9 consisting of a striped Au plated layer which is facing the p type striped region 6 are laminated and formed on the surface of the cap layer 5 consisting of n type GaAs. In the case of the semiconductor laser element having such a structure, the active layer 3 has a smaller band gap as compared with the clad layers 2, 4 in both sides and has a large refraction coefficient. As a result, an injected carrier generated by applying a voltage to said electrodes is also enclosed within the active layer 3 together with the light. These couple of enclosing effects lower a threshold current level required for laser oscillation and realize a continuous operation of the semiconductor junction laser element under a room temperature.

In such a laser element, the surface (X-Y) in the front side in FIG. 1 and the surface in the opposite side are completed as the mirror surfaces by the cleavage process. The light generated within the active layer 3 under the striped region 6 is reflected by these mirror surfaces and advances reciprocally in the direction of the Z-axis, resulting in the laser oscillation. Thereby, a part of such light beam can be obtained as the laser beam from the mirror surface.

Namely, a couple of flat surfaces facing mutually and orthogonally crossing the Z-axis direction form the mirror surfaces for the laser resonator. In general, a crystal orientation is selected so that the major surface of substrate 1 is the crystal surface of the orientation of (100). Therefore, the epitaxial semiconductor layers 2, 3, 4 and 5 also have the major surface of the crystal surface in an orientation of (100). Usually, the crystal surface (110) which is in a right angle to the surface (100) is selected as the cleavage surface.

Then, a method for severing the wafer for forming semiconductor laser elements by an embodiment of this invention will be explained.

Figure 2:
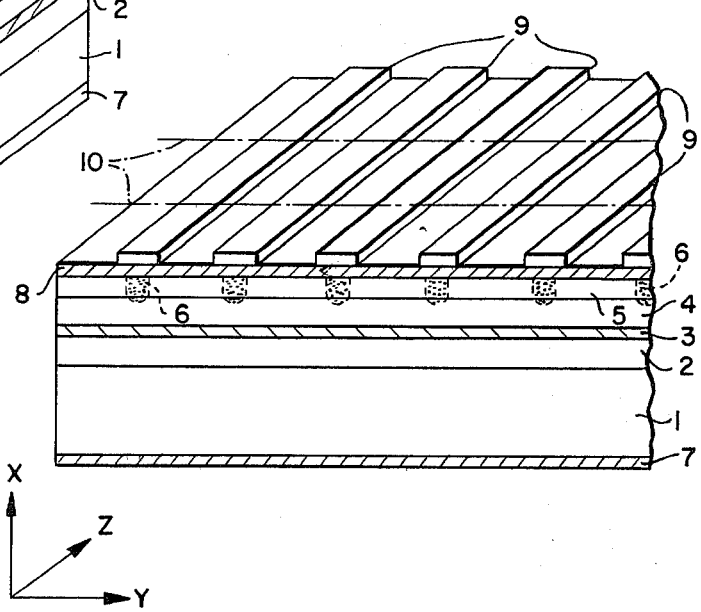
FIG. 2 is a perspective view indicating a part of a semiconductor laser wafer produced by applying the method of this invention.

FIG. 2 indicates a wafer for forming a plurality of striped laser elements. This wafer has the double hetero structure which is same as that in FIG. 1 with the junction structures indicated by 1 to 8. In addition, a plurality of striped electrodes 9 which are formed, for example, by selectively plating Au in the form of stripes with the thickness of 6 $\mu$m and the width of 70 $\mu$m provided at the surface of this wafer which is facing the striped region 6 where the Zn is diffused. Here, it is a feature of this invention that this electrode 9 be formed in a continuous pattern even in the area between the adjacent elements in the longitudinal direction of the stripes. The conditions required for the scribing process of a wafer thus structured are that a pressure of about 30 g is applied to the scriber e.g., a 3-point cutter) having a diamond chip with the point angle of 110°; the point of the scriber is set to the depth of 50$\mu$ from the surface; and scribing is performed at the speed of 50 mm/sec along the surface in the orientation of (110). Planned scribing lines 10 are illustrated in FIG. 2. Then, the wafer is cracked and separated by slightly applying a force with a roller from the rear side of the wafer (the surface opposing the scribed surface).

Figure 3:
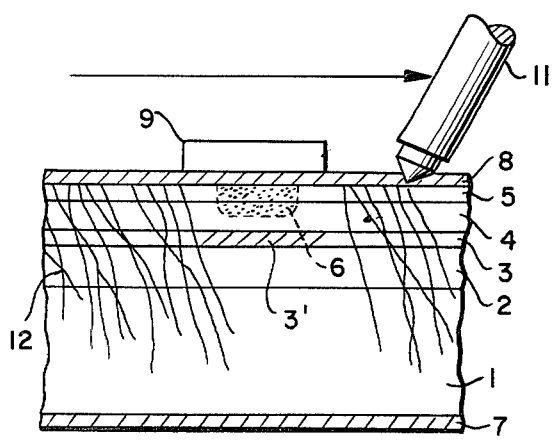
FIG. 3 is a cross-section indicating a part of the wafer in the scribing process.

FIG. 3 indicates a cross-section of a part of wafer along one of the planned scribing lines 10 shown in FIG. 2. In this figure, the scribing condition is indicated. The elements shown in FIG. 3 are given the same numbering for the corresponding portions shown in FIG. 2.

When the wafer surface is scratched by the scriber, generally designated by numeral 11, countless minute cracks 12 extending toward the inside of substrate 1 are generated from the scribed scratches. These cracks 12 are formed almost along the surface (110). In the same way, a residual stress exists within the wafer by means of the scribed scratches. Here, it should be noted that scratches by scribing are not formed on the light emitting region 3' and cracks 12 and the stress do not reach the light emitting region 3'. This is because the protective film 9 consisting of Au protects the surface from scratches by scribing. The light emitting region 3' is located within the active layer 3, just below the p type region 6 for defining a current route.

When the above wafer is scribed, the Au layer 9 is reduced by about 3 $\mu$m in thickness along the scribed line. This value changes, of course, depending on the pressure applied on the scriber point. Experiments show that about 1 to 2 $\mu$m is reduced in thickness for a scriber pressure of 20 g, while 3 to 5 $\mu$m is reduced for a scriber pressure of 40 g.

At any rate, the breakdown strength of a crystal of the wafer in this embodiment is about $10^{10}$ dyn/cm$^2$ and therefore the scribing must be done by applying a pressure exceeding such value by means of the scriber 11.

Figure 4A:
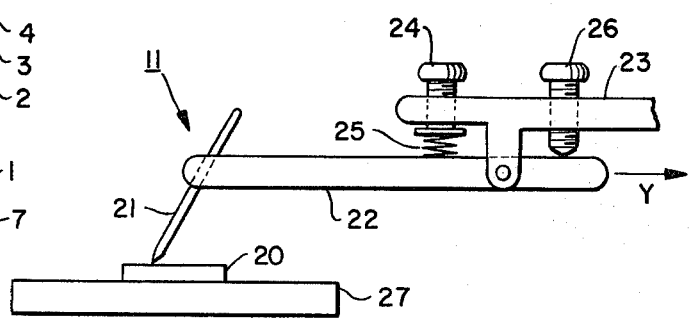
FIG. 4A and FIG. 4B respectively indicate the side view and front view of the scribing apparatus which is used in the embodiment of the scribing process of this invention.
Figure 4B:
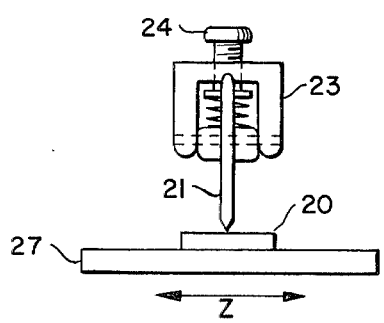

An example of a scribing apparatus 11 used in this invention is indicated in FIG. 4A and FIG. 4B. FIG. 4A and FIG. 4B are respectively a side view and front view of this scribing apparatus. As indicated in FIG. 4, a scriber 21 for scribing a wafer 20 is fixed to an arm 22. The arm 22 is supported rotatably by means of the arm support 23. Adjusting screw 24 is provided for giving the desired force to the arm 22 by means of a spring 25 and thereby a force for pushing the scriber 21 to the wafer can be adjusted. On the other hand, depth of scratches by the scriber can be set by limiting an angle of the arm 22 by means of an adjusting screw 26. The arm support 23 is moved in the direction of the Y axis for the wafer 20 mounted on the stage 27 by means of the not illustrated driving system and thereby scribing is performed. In returning the arm to the original position, the arm support 23 is elevated by the driving system so that the scriber 21 does not come into contact with the surface of wafer 20. Simultaneously with the returning operation of the arm 22 and arm support 23 along the Y axis direction, the stage 27 advances only for the distance which is equal to the desired resonator length in the Z axis direction. Desirably, the stage 27 provides a vacuum chuck (not illustrated) for absorbing and holding the wafer 20. The advancement in the Z axis direction can be adjusted with an accuracy of 1-micron or less.

Figure 5:
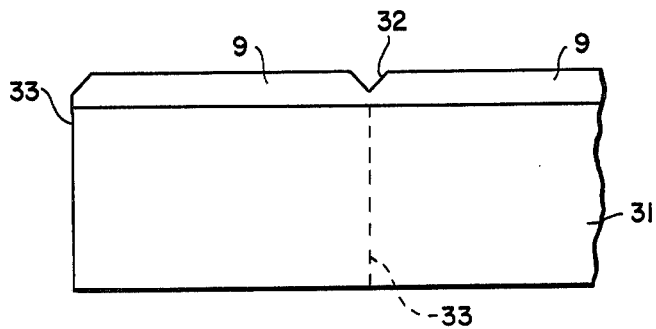
FIG. 5 is a cross-section indicating a part of the wafer which has completed the scribing process.

The cracking process following the scribing process is carried out by applying such a stress on the wafer that the wafer curves backward along the longitudinal direction of the stripes. A part of the cross-section of the wafer along the longitudinal direction of a striped electrode 9 in the cracking process is indicated schematically in FIG. 5. At the Au layer 9 on the wafer 31, a groove 32 is formed by the scribing. When a stress as explained previously is applied on the wafer from the rear side, the wafer generates cleavages along the scribing line. Since scratches by the scribing are not formed on the crystal surface under the Au layer 9, cleaving is performed along a certain crystal surface (110) 33 laying along the production line of the scribing line. Scratches formed by the scribing have a width in the order of several microns, while the crystal surface 33 under the layer 9 has a flatness in the order of several Å. Referring again to FIG. 3, since the cleaving occurs along the countless minute cracks 12 in the region where scratches are formed by the scribing, the resultant cleaved surfaces are very rough. This is because the cracks 12 are formed along the orientation (110) and the cracks 12 which extend toward the inside of the crystal substrate from the scribed scratches having a width of several microns are capable of forming different countless surfaces in the orientation of (110). On the other hand, cleaving is performed is such a way under the Au layer 9 that only a certain crystal surface (110) 33 is exposed. The cleaved surface under this Au layer 9 is flat and works as the mirror surface for the laser resonator. In other words, only the cleaved surface of the area where the light emitting region 3' in the active layer 33 is exposed, namely the cleaved surface of the area where the laser beam is reflected or radiated, can work as the surface for the laser resonator.

According to this invention, a cleaved surface in the region working efficiently as the mirror surface for the laser resonator is very flat. Therefore, a semiconductor laser element by this invention provides a laser resonator having a very satisfactory characteristic.

Figure 6:
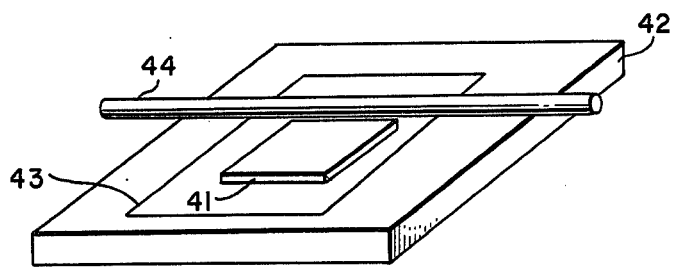
FIG. 6 is a cracking apparatus which is used in an embodiment of the cracking process of this invention.
Figure 7:
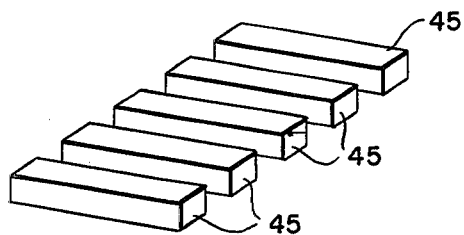
FIG. 7 is a perspective view of a semiconductor rod which is formed by severing a wafer in the embodiment of this invention.

By referring to FIG. 6, a practical example of the cracking process used in this invention is explained. The scribed wafer 41 is put on a flexible base, such as a rubber sheet 42, desirably via a sheet of paper or resin film in order to prevent contamination, with the scribed surface facing the base 42. Thus the roller 44 is pushed onto the rear side of wafer 41 in such a way that the longitudinal direction of the roller becomes parallel with the Y axis direction of the wafer and then rolled over the wafer in the Z-axis direction. By this rolling, the wafer 41 is severed along the scribing lines. FIG. 7 shows the bar-shaped semiconductor laser element arrays 45 obtained from the wafer by the cracking process.

Although explanation is omitted, in the previous scribing process, it is desirable to perform the scribing to the wafer up to the intermediate position of the adjacent Au layer 9 along the Z-axis direction as in the case of the scribing along the Y-axis direction. When the scribing along the Z-axis direction is performed, a semiconductor laser element as shown in FIG. 1 can be completed from the laser element array 45 through rolling being done in the Y-axis direction, similar to that performed and explained in FIG. 6. However, this invention is not related to the manner of obtaining the surface which is parallel to the Z-axis.

Figure 8:
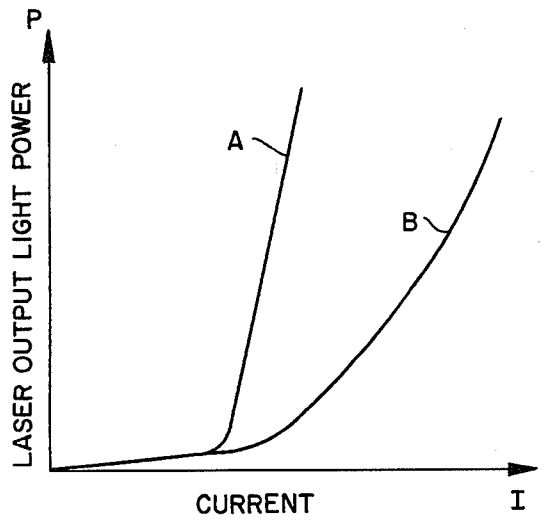
FIG. 8 shows a graph indicating the current vs. optical output characteristic of a couple of semiconductor laser elements produced by the method of this invention and another method referred to for comparison.

FIG. 8 depicts a graph indicating the current-laser output light power characteristics of a semiconductor laser element. The curve A indicates the characteristic of a laser element produced by this invention, while the curve B indicates a characteristic of a laser element produced by another method for comparison purposes. The element prepared for comparison differs from the element used in the embodiment of this invention only in such points that the Au layer 9 is not used and therefore the scratches by the scribing are formed also on the crystal surface on the light emitting region. The fact that the element produced by the process of this invention can increase rapidly a laser output light power for an increase of a current mass that this element has a laser resonator with an excellent performance characteristic.

Figure 9A:
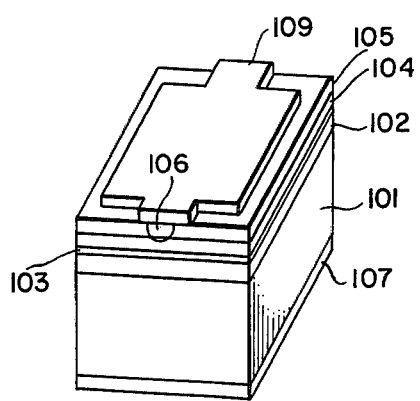
FIG. 9A and FIG. 9B are perspective views of a semiconductor laser element and a wafer in another embodiment of this invention.

Another embodiment of this invention is explained hereafter by referring to FIG. 9. A semiconductor laser element to be produced by the embodiment of this invention is indicated in the perspective view of FIG. 9A. The structure of the crystal body of the element is substantially the same as that of the element indicated in FIG. 1. Namely, an n type GaAlAs layer 102, a p type active layer 103, a p type GaAlAs layer 104 and an n type GaAs layer 105 are sequentially laminated on an n type GaAs substrate 101. Each layer can be formed by the well known epitaxial growth technique. In order to limit the light emitting region to a part of the active layer 103, a p type region 106 is provided up to the p type GaAsAs layer 104 from the surface of GaAs layer 105. The p type region 106 has the shape of a stripe and a route of current flows from an electrode 109 formed on the element surface to an electrode 107 formed at the bottom side of the element. Therefore the light emitting region is limited to the portion directly under such p type region 106. Thereby, the shape of the light emitting region is defined. The only area under the p type region 106 among the surfaces where the active layers 103 are exposed works as the mirror surface for the laser resonator. A laser output light power is radiated from this mirror surface of the resonator. Design dimensions of this laser element are 100 $\mu$m in thickness, 300 $\mu$m in length and 300 $\mu$m in width.

Figure 9B:
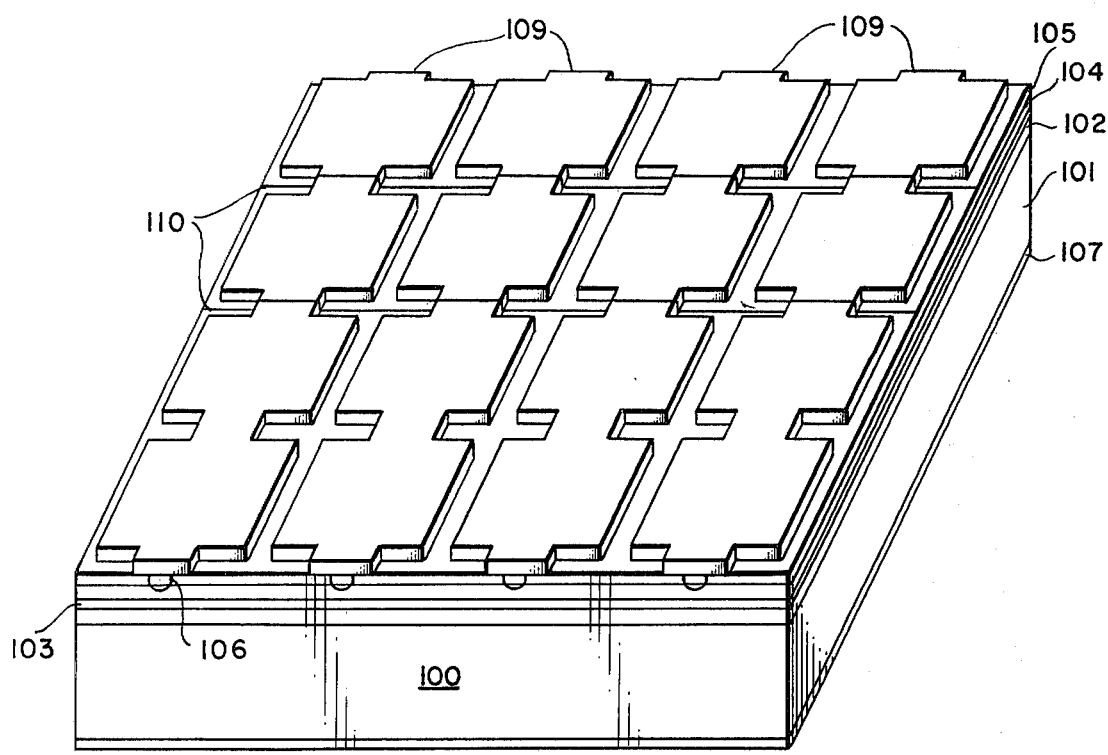

A method for producing a laser element indicated in FIG. 9A will be explained by referring to FIG. 9B. In the wafer indicated in FIG. 9B, 16 elements of FIG. 9A are shown, but actually the wafer has a size as large as comprising, for example, 1600 laser elements. The electrode 109 consisting of Au works as the protective film in the scribing process. The Au layer 109 can be patterned by well known techniques, such as a plating process and a succeeding photo-etching process. In this embodiment, thickness of the Au layer 109 is 1.4 $\mu$m. The pattern of the Au layer 109 has a width of 80 $\mu$m along the planned scribing line. The region not covered with the Au layer 109 has a width of 220 $\mu$m along the planned scribing line. The scribing for the wafer 100 is performed by the scribing apparatus indicated in FIG. 4 using the same diamond scriber as that used in the preceding embodiment. The scribing system is so adjusted that a pressure of about 3 g is applied on the diamond chip of the scriber. This pressure causes a stress of about $10^{11}$ dyn/cm$^2$ on the wafer crystal through the diamond chip of the scriber. A couple of lines of scratches 110 formed by the scribing are indicated in FIG. 9B. In addition, observation has proved that the width of scratches 110 formed on the crystal surface is about 4 $\mu$m. Scratches 110 are also formed on the surface of Au layer 109 but they do not reach the surface of the crystal layer 105 under the Au layer 109. The Au layer is especially effective as the protective film since it is comparatively soft enough for absorbing a pressure of the scriber and effectively protects the crystal substrate from being stressed. A resin film, such as a photo resist layer, can also be used as the protective film in place of the Au layer 109. However, a protective film consisting of resin has a disadvantage in that it must be eliminated before completion of an element.

Figure 10:
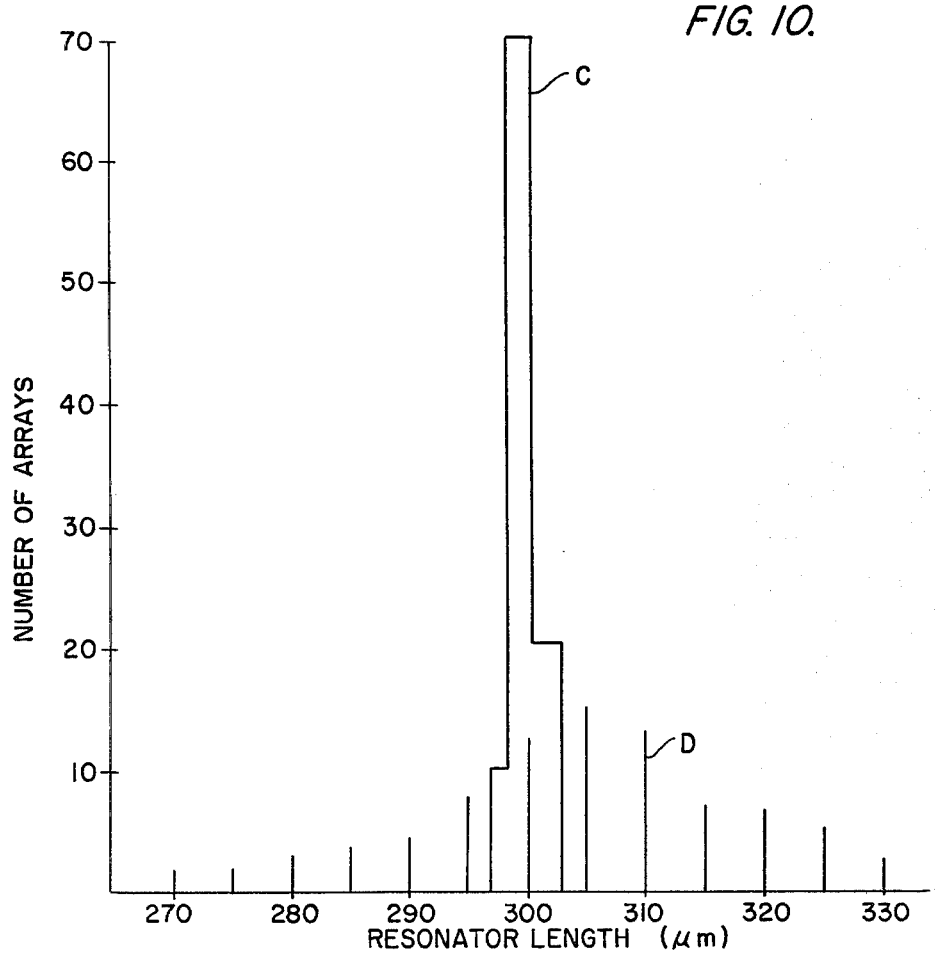
FIG. 10 shows a graph indicating distribution of resonator lengths of laser elements produced by the method of this invention and the conventional method.

Although not illustrated, scribing is also performed between the striped Au layer patterns 109 in such a way as crossing orthogonally the scribe lines 110. The cracking process is executed by the method indicated in FIG. 6. In this process, 100 laser element arrays as indicated in FIG. 7 are produced, and distribution of widths, namely resonator lengths, are plotted in the graph shown in FIG. 10. Each array has the structure where 40 semiconductor laser elements (indicated in FIG. 8) are coupled in a line. In FIG. 10, distribution C represents resonator lengths of 100 arrays produced in accordance with the embodiment of this invention. Distribution D represents, for comparison, the distribution of resonator lengths of 100 arrays produced by a conventional method using a razor blade. According to this invention, it can be understood, an accurate resonator length can be obtained as designed.

In the wafer of FIG. 9B, the width of the Au layer pattern 109 formed along the scribe line is 80 $\mu$m, but even if it is 200 $\mu$m, an element can be formed in an accurate size. In other words, when the scratches by scribing on the crystal substrate surface are formed for a length of $\frac{1}{3}$ or more in the full length of the scribe line, an accurate cleavage becomes possible.

Figure 11A:
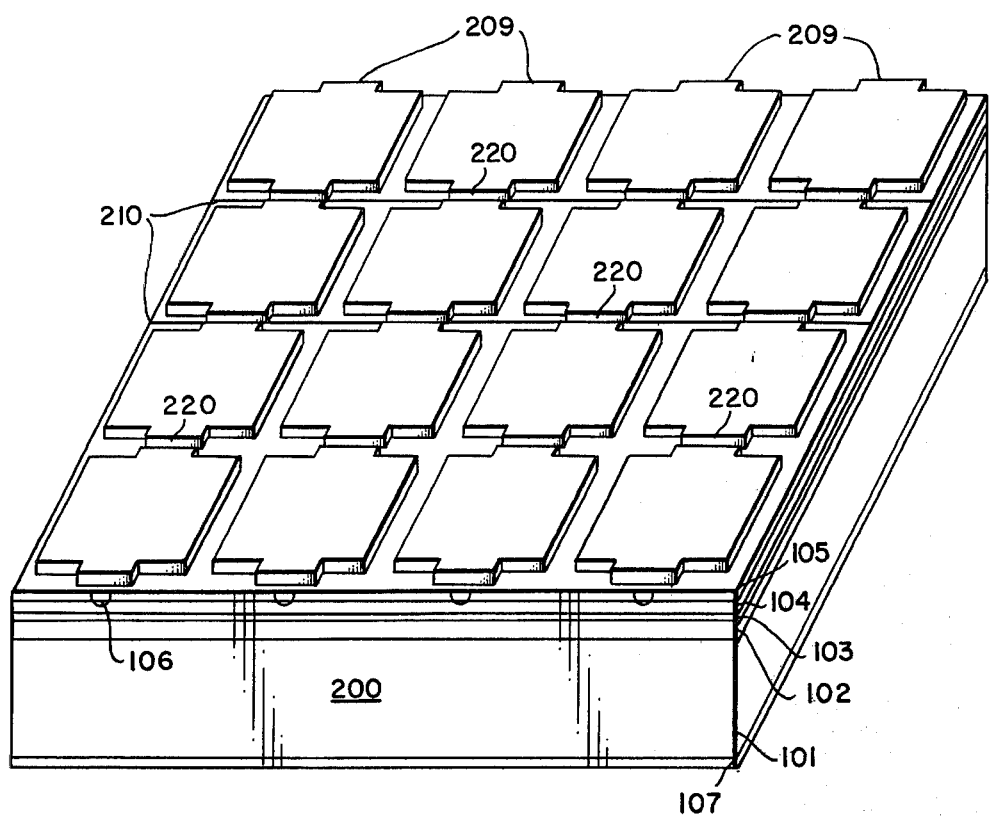
FIG. 11A and FIG. 11B are a perspective view indicating a wafer for a semiconductor laser in another embodiment of this invention and a cross-section partly indicating a wafer and scriber in the scribing process of this invention.

Another embodiment of this invention will be explained below by referring to FIG. 11. The wafer 200 indicated in FIG. 11A is different from the wafer 100 indicated in FIG. 9B only in the structure of the Au electrode layer 209 on the surface. Therefore, in FIG. 11A, the same elements as depicted in FIG. 9B are given the same numbering. The pattern of the Au layer 209 characteristically has a small gap 220 along the planned scribe line. For example, when the thickness of the Au layer 209 is 7 $\mu$m, the width of gap 220 is, for example, 10 $\mu$m. The art of providing a comparatively thick electrode metal layer on an element is well known, such as using the Plated Heat Sink (PHS) technique. In the case of forming a PHS type element, a thick metal layer works not only as an electrode but also a heat sink for a temperature rise due to the heat generated in the element. The scribing is conducted along the gap 220. In case the scribing is executed with a scriber, for example having an angle of 110°, scratches by the scribing are not formed on the crystal substrate surface exposed in the gap. This is because the point of the diamond chip does not reach the bottom of the gap.

Figure 11B:
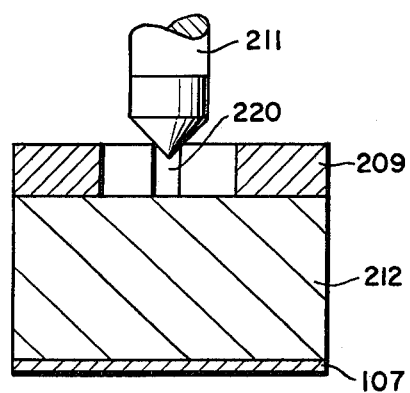

A cross-section of the wafer 200 under the scribe process is partly indicated in FIG. 11B. In case a scriber 211 is located on the gap 220 of the Au layer 209, the scribing is executed by applying such a pressure to the scriber 211 that the top of scriber 211 does not come into contact with the surface of crystal substrate, generally designated by the reference numeral 212.

Upon completion of the scribe process, the wafer 200 may be severed by applying the cracking process in the same way as described for the previous embodiment.

A particular advantage of the method indicated in the embodiment of FIG. 11A over the embodiment of FIG. 9B is that the Au layer 209, which is used as the protective film, is not required to be torn off in the cracking process because of the gap 220. In other words, in the FIG. 9B embodiment, the electrode metal film continuously extends over the adjacent elements, and when it is comparatively thick, only the crystal substrate is separated along the cleaved surface in the cracking process, and all elements remain coupled by the electrode metal film. Therefore, in that case, the electrode metal film must be torn off. Tearing off of the electrode metal film results in a risk of producing a defective element where the electrode metal film does not remain in accordance with the required electrode pattern. One alternative way to eliminate the tearing off of the electrode metal is to use another film which may be eliminated before or after the cracking process, such as a photo resist film, as the protective film. As the protective film, well known photoresist materials can be used. This modification to the FIG. 9B embodiment, however, has a disadvantage because an extra process is required.

In the above embodiments, while the structures of specific type semiconductor laser elements have been explained in order to provide a full understanding of this invention, the spirit of this invention does not substantially depend on the internal structure of the laser elements. Therefore, the method of this invention can be adapted for producing every kind of semiconductor laser element within the scope specified by the the following claims.

What is claimed is:

1. A method for producing a semiconductor laser element comprising a crystalline semiconductor body, a light emitting region in said semiconductor body and a pair of mirror surfaces of said body for forming a laser resonator, the method comprising the steps of:
   preparing a semiconductor wafer from which a plurality of said laser elements are to be produced, the wafer having a plurality of said light emitting regions,
   forming scratches on a surface of said wafer along a plurality of lines where the wafer is to be separated except on a region of the wafer surface located above the light emitting regions, and
   cracking said wafer along said scratches to separate the wafer along said lines.

2. A method for producing a semiconductor laser element comprising a semiconductor body, a light emitting region in said semiconductor body and a mirror surface of said body for forming a laser resonator, the method comprising the steps of:
   preparing a semiconductor wafer from which said semiconductor laser element is to be produced, the wafer having said light emitting region therein,
   providing on said wafer a protective film covering a surface of said wafer at a region above said light emitting region and exposing a part of the surface of said wafer,
   scribing on said wafer to form scratches on said exposed part of the surface of said wafer along a line where the wafer is to be separated, and
   cracking said wafer along said scratches to separate the wafer along said line.

3. The method as defined in claim 2, wherein said protective film comprises a metal.

4. The method as defined in claim 3, wherein said protective film comprises gold.

5. The method as defined in claim 2, wherein said protective film comprises a resin.

6. The method as defined in claim 5, wherein said protective film comprises a photoresist.

7. A method for producing semiconductor laser elements, each element comprising a crystalline semiconductor body, a light emitting region having a stripe shape defined in said semiconductor body and a pair of mirror surfaces of said semiconductor body for forming a laser resonator for the element, the method comprising the steps of:
   preparing a semiconductor wafer from which a plurality of said laser elements are to be formed, the wafer having at least one stripe region for forming said light emitting region,
   providing on a major surface of said wafer a protective film covering said stripe region and exposing the remaining region of the surface of said wafer,
   scribing on the major surface of said wafer to form scratches on the remaining region of the surface of said wafer along at least one line across said stripe region, and
   cracking said wafer along said scratches to separate the wafer along said line thereby to form said semiconductor laser elements.

8. The method as defined in claim 7, wherein said protective film comprises a metal.

9. The method as defined in claim 8, wherein said protective film comprises gold.

10. The method as defined in claim 7, wherein said protective film has a gap along said at least one line, the gap having a width narrow enough to prevent the scratches from being formed on the surface of the wafer under the gap.

11. A method for producing semiconductor laser elements, each element comprising a crystalline semiconductor body, a light emitting region having a stripe shape defined in said body and a pair of mirror surfaces of said semiconductor body for forming a laser resonator for the element, the method comprising the steps of:
   preparing a semiconductor wafer from which a plurality of said laser elements are to be formed, the wafer having a plurality of stripe regions for forming said light emitting regions, each of said stripe regions being disposed in parallel with each other on a major surface of said wafer,
   providing on the major surface of said wafer a protective film having a pattern to cover said stripe regions and expose the remaining region of the major surface of said wafer,
   scribing on said major surface of said wafer to form scratches on both the remaining region of said major surface of said wafer and on said protective film along a plurality of lines across said stripe regions, and
   cracking said wafer along said scratches to cleave and separate the wafer along each of said lines to form along said lines a plurality of cleaved surfaces for providing said mirror surfaces thereby to obtain a plurality of the semiconductor laser elements.

12. The method as defined in claim 11, wherein said protective film has a plurality of gaps along said lines, each of said gaps having a width narrow enough to prevent the scratches from being formed on the surface of the wafer in each of the gaps.

13. The method as defined in claim 11 or 12, wherein the protective film comprises a metal film serving as an electrode for the laser element.

14. The method as defined in claim 13, wherein the protective film comprises gold.

15. The method as defined in claim 7 or 11 wherein said protective film comprises a resin.

16. The method as defined in claim 15 wherein said protective film comprises a photoresist.

17. The method as defined in claim 16 comprising the subsequent step of removing the protective film.

18. The method as defined in claim 5 or 6 comprising the subsequent step of removing the protective film.

19. The method as defined in claim 3, 4, 8, or 9, wherein the metal protective film provided on said wafer surface forms an electrode for the laser element.

20. The method as defined in claim 7 or 11, wherein the mirror surfaces of said semiconductor body for providing a laser resonator of the laser element are formed along the cleaved surfaces under the protective film developed by the cracking step of said wafer, said cleaved surfaces being substantially orthogonal to the longitudinal axis of said light emitting stripe region of said laser elements.

21. The method as defined in claim 11 comprising, subsequent to the step of cracking, the further step of dividing the semiconductor elements in an intermediate position between the plurality of light emitting stripe regions in a direction substantially parallel to the longitudinal direction of said stripe regions.

22. The method as defined in claim 20 comprising, subsequent to the step of cracking, the further step of dividing the semiconductor elements in an intermediate position between the plurality of light emitting stripe regions in a direction substantially parallel to the longitudinal direction of said stripe regions.

23. The method as defined in claim 20, wherein the mirror surfaces developed by the step of cracking are formed as opposite ends of said semiconductor laser element.

24. The method as defined in claim 2, 7, or 11, wherein the thickness of the protective film and the scribing pressure are predetermined so that scratches are formed on the exposed region of the wafer surface but are not formed on the region of the wafer surface under the protective film.

25. The method as defined in claim 24, wherein the protective film is gold, the thickness of the protective film is approximately from 3 to 6 $\mu$m, and the scribing pressure is approximately from 20 to 40 g.

26. The method as defined in claim 24, wherein the protective film is gold, the thickness of the protective film is approximately 1.4 $\mu$m, and the scribing pressure is approximately 3 g.

* * * * *

UNITED STATES PATENT AND TRADEMARK OFFICE
CERTIFICATE OF CORRECTION

PATENT NO. : 4,306,351

DATED : Dec. 22, 1981

INVENTOR(S) : Ohsaka et al.

It is certified that error appears in the above—identified patent and that said Letters Patent is hereby corrected as shown below:

```
[56] References Cited, line 3, "Gobrail" should be --Gabrail--.
[57] Abstract, line 21, "protection" should be --protective--.
Column 1, line 8, after "element," insert --and more--;
Column 1, line 9, delete "and more";
Column 1, line 26, after "elements" delete ",".
Column 2, line 6, after "of" delete "a";
Column 2, line 54, "rought" should be --rough--.
Column 3, line 5, after "photo" insert --resist--.
Column 6, line 46, "33" should be --3--.
Column 7, line 26, "mass" should be --means--.
```

Signed and Sealed this

First Day of June 1982

[SEAL]

Attest:

GERALD J. MOSSINGHOFF

Attesting Officer      Commissioner of Patents and Trademarks